United States Patent
Ishikawa

(10) Patent No.: US 12,122,216 B2
(45) Date of Patent: Oct. 22, 2024

(54) HEATER DEVICE

(71) Applicant: DENSO CORPORATION, Kariya (JP)

(72) Inventor: Kimitake Ishikawa, Kariya (JP)

(73) Assignee: DENSO CORPORATION, Kariya (JP)

(*) Notice: Subject to any disclaimer, the term of this patent is extended or adjusted under 35 U.S.C. 154(b) by 791 days.

(21) Appl. No.: 17/209,734

(22) Filed: Mar. 23, 2021

(65) Prior Publication Data

US 2021/0206230 A1   Jul. 8, 2021

Related U.S. Application Data

(63) Continuation of application No. PCT/JP2019/036774, filed on Sep. 19, 2019.

(30) Foreign Application Priority Data

Oct. 9, 2018 (JP) ................... 2018-191138

(51) Int. Cl.
*B60H 1/00* (2006.01)
*G06F 3/0354* (2013.01)
*H05B 3/26* (2006.01)

(52) U.S. Cl.
CPC ..... *B60H 1/00742* (2013.01); *G06F 3/03547* (2013.01); *H05B 3/26* (2013.01)

(58) Field of Classification Search
CPC . G06F 3/03547; H05B 3/26; H05B 2203/013; H05B 3/267; H03K 17/962;
(Continued)

(56) References Cited

U.S. PATENT DOCUMENTS

| 6,376,939 B1 | 4/2002 | Suzuki et al. |
| 2012/0105369 A1* | 5/2012 | Nakamura ............. G06F 3/044 345/174 |
| 2016/0039265 A1 | 2/2016 | Ota et al. |

FOREIGN PATENT DOCUMENTS

| JP | H05138592 A | 6/1993 |
| JP | H06347355 A | 12/1994 |

(Continued)

OTHER PUBLICATIONS

Machine translation of JP 2018133289 A performed on Dec. 7, 2023, Bando (Year: 2018).*

(Continued)

*Primary Examiner* — Dana Ross
*Assistant Examiner* — Kevin Guanhua Wen
(74) *Attorney, Agent, or Firm* — Harness, Dickey & Pierce, P.L.C.

(57) ABSTRACT

A heater device includes a contact determination unit for determining contact or non-contact of an object based on a change in capacitance between a plurality of electrodes. The contact determination unit is configured to determine (i) the contact of the object in response to a determination that the change in capacitance between the plurality of electrodes per predetermined unit time is a change in one direction and equal to or larger than a first determination threshold value. The contact determination unit is configured to determine (ii) the non-contact of the object in response to a determination that the change in capacitance between the plurality of electrodes per predetermined unit time is a change in a direction opposite to the one direction and equal to or larger than a second determination threshold value.

4 Claims, 10 Drawing Sheets

(58) Field of Classification Search
CPC ........ H03K 2217/94031; H03K 2217/960705; H03K 2217/960775; B60H 2001/2231; B60H 1/2227

See application file for complete search history.

(56) References Cited

FOREIGN PATENT DOCUMENTS

| | | | | | |
|---|---|---|---|---|---|
| JP | 3972064 | B2 | | 9/2007 | |
| JP | 2010234852 | A | | 10/2010 | |
| JP | 2011014527 | A | * | 1/2011 | ........... H03K 17/962 |
| JP | 5519487 | B2 | | 6/2014 | |
| JP | 2014190674 | A | | 10/2014 | |
| JP | 2018133289 | A | * | 8/2018 | ............... H05B 3/00 |
| WO | WO 2016167075 | A1 | * | 10/2016 | ........... B60H 1/2218 |

OTHER PUBLICATIONS

Machine translation of JP 2011014527 A performed on Dec. 7, 2023, Kogo et al. (Year: 2011).*

Machine translation of WO 2016167075 A1 performed on Dec. 7, 2023, Oide et al. (Year: 2016).*

* cited by examiner

HEATER DEVICE

CROSS REFERENCE TO RELATED APPLICATIONS

The present application is a continuation application of International Patent Application No. PCT/JP2019/036774 filed on Sep. 19, 2019, which designated the U.S. and claims the benefit of priority from Japanese Patent Application No. 2018-191138 filed on Oct. 9, 2018, the entire disclosure of the above application is incorporated herein by reference.

TECHNICAL FIELD

The present disclosure relates to a heater device.

BACKGROUND

A heater device may be mounted on an interior surface of a vehicle to warm an occupant in the vehicle. The occupant may touch the heater device and may feel too hot at a contact portion, e.g., a finger or the like. The heater device is required to keep the occupant comfortable even if the occupant touches the heater device. In the above aspects, or in other aspects not mentioned, there is a need for further improvements in a heater device.

SUMMARY

According to a first aspect of the present disclosure, the heater device comprises a heat generating portion arranged on an insulating base material, and a plurality of electrodes which are arranged on the insulating base material and are configured to detect a contact or a non-contact of an object. The heater device further comprises a contact determination unit which determines the contact or the non-contact of the object based on a change in capacitance between the plurality of electrodes. The contact determination unit is configured to determine: (i) the contact of the object in response to a determination that the change in capacitance between the plurality of electrodes per predetermined unit time is a change in one direction and equal to or larger than a first determination threshold value; and (ii) the non-contact of the object in response to a determination that the change in capacitance between the plurality of electrodes per predetermined unit time is a change in a direction opposite to the one direction and equal to or larger than a second determination threshold value.

According to this configuration, the contact determination unit is configured to determine (i) the contact of the object in response to a determination that the change in capacitance between the plurality of electrodes per predetermined unit time is a change in one direction and equal to or larger than a first determination threshold value. The contact determination unit is configured to determine (ii) the non-contact of the object in response to a determination that the change in capacitance between the plurality of electrodes per predetermined unit time is a change in a direction opposite to the one direction and equal to or larger than a second determination threshold value. Therefore, it is possible to determine the contact or the non-contact more accurately while suppressing the influence of temperature change.

The reference numerals in parentheses attached to the components and the like indicate an example of correspondence between the components and the like and specific components and the like described in an embodiment to be described below.

BRIEF DESCRIPTION OF DRAWINGS

The disclosure is further described with reference to the accompanying drawings in which:

FIG. 16 is a diagram for explaining a process for correcting an AD value indicating a capacitance to 0 after it is determined that an object comes into contact with.

DETAILED DESCRIPTION

Figure 1:
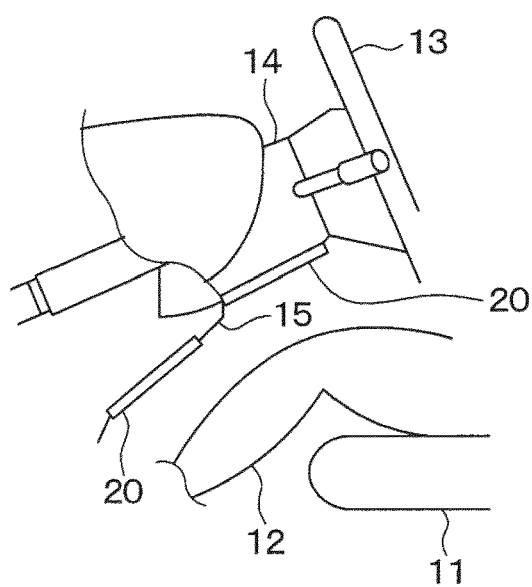
FIG. 1 is a diagram showing a mounting position of a heater device according to a first embodiment.

Hereinafter, embodiments of the present disclosure will be described with reference to the drawings. In the following embodiments, identical or equivalent elements are denoted by the same reference numerals as each other in the figures.

First Embodiment

A heater device according to a first embodiment is described with reference to FIGS. 1 to 8. As shown in FIG. 1, the heater device 20 is installed in an interior of a moving body such as a road traveling vehicle. The heater device 20 is a part of the heating device for the interior. The heater device 20 is an electric heater that is supplied with a power from a power supply such as a battery and a generator mounted on the moving object to generate heat. The heater device 20 has a thin plate-shape. The heater device 20 generates heat when power is supplied. The heater device 20 radiates a radiant heat primarily in a direction perpendicular to a surface of the heater device 20 to warm a target object positioned in the direction perpendicular to the surface.

A seat 11 for an occupant 12 is installed in the interior. The heater device 20 is installed in the interior to radiate the radiant heat to feet of the occupant 12. The heater device 20 can be used for quickly providing warmth to the occupant 12 immediately after activating other heating devices, for example. The heater device 20 is installed on a wall surface of the interior. The heater device 20 is arranged to face the occupant 12 who is in an assumed normal posture. The road traveling vehicle has a steering column 13 for supporting a steering wheel 14. The heater device 20 is installed on a lower surface of the steering column 14 and a lower surface of a column cover 15 so as to face the occupant 12.

Figure 2:
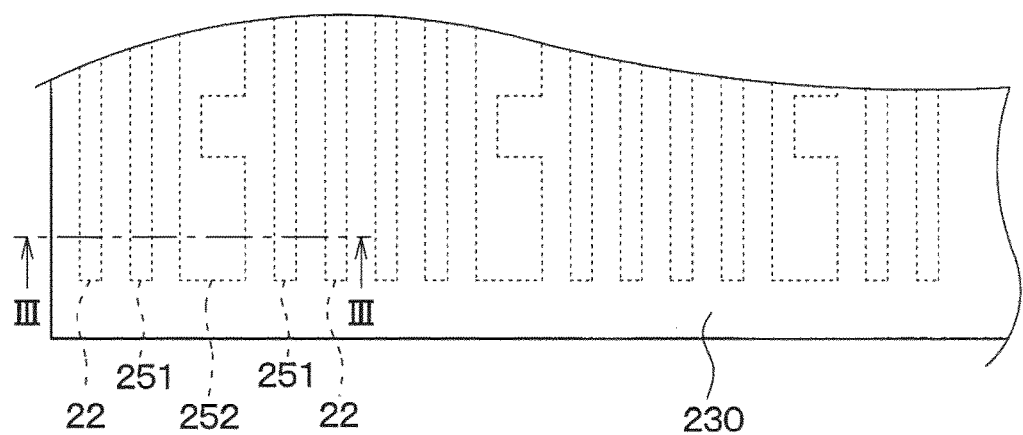
FIG. 2 is a diagram showing a configuration of the heater device according to the first embodiment.
Figure 3:
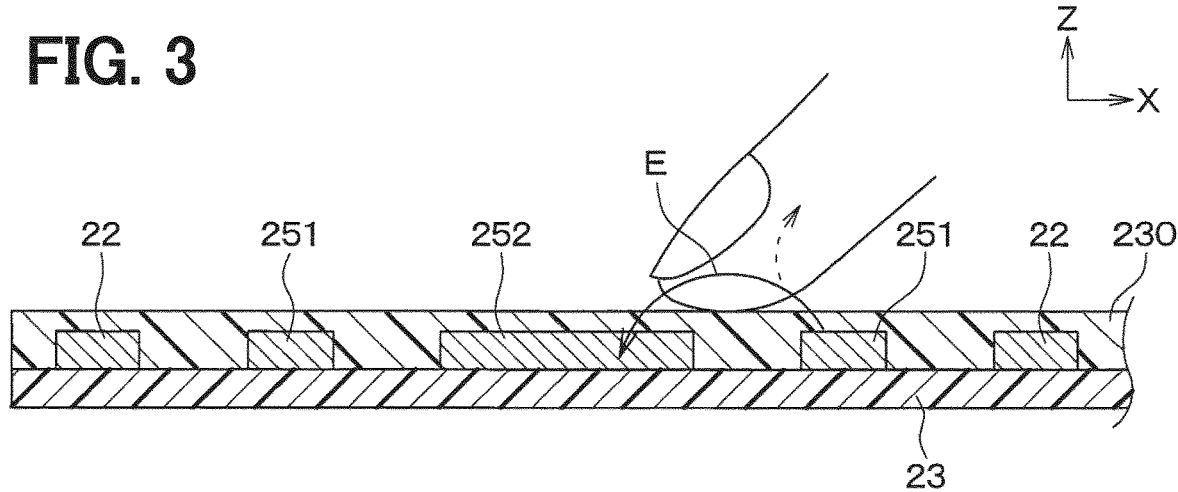
FIG. 3 is a cross-sectional view on a line III-Ill in FIG. 2.
Figure 4:
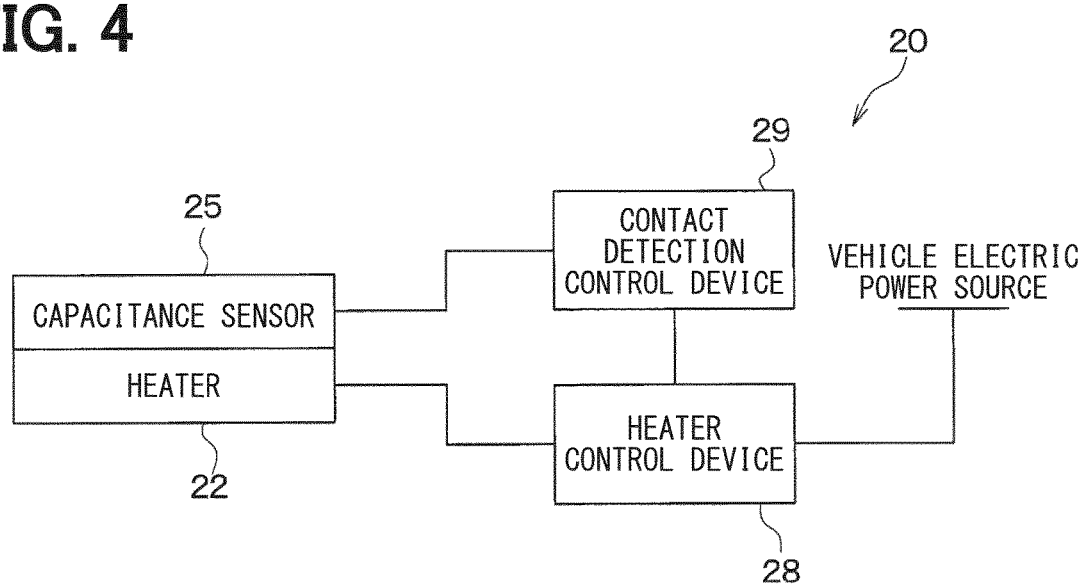
FIG. 4 is a block diagram of the heater device according to the first embodiment.

The configurations of the heater device 20 is described with reference to FIGS. 2 to 4. As shown in FIGS. 2 to 4, the heater device 20 includes a heat generating portion 22, an insulating base material 23, a capacitance sensor portion 25, an insulating layer 230, a heater control device 28, and a contact detection control device 29. The heater device 20 is configured as a radiant heater having a structure in which in a case that an object comes into contact with the capacitance sensor portion 25, a temperature of the contacted portion is rapidly lowered. A mechanical structure of the heater device is also disclosed in JP2014-190674A. JP2014-190674A is incorporated herein by reference as a part of this disclosure.

The heat generating portion 22, the transmitting electrode 251 and the receiving electrode 252 are formed by a pattern printing method on an occupant side surface of the insulating base material 23. The heat generating portion 22, the transmitting electrode 251 and the receiving electrode 252 of the present embodiment are arranged on one surface of the insulating base material 23.

The insulating base material 23 is made of an insulating resin formed in a substantially quadrangular thin plate shape.

The heat generating portion 22 generates heat in response to an energization, i.e., when it is activated by supplying electric power. The heat generating portion 22 can radiate radiant heat that makes the occupant 12 feel warm by generating heat. A plurality of heat generating portions 22 are made of a material having a high thermal conductivity.

The heat generating portion 22 may be made of a metallic material. The material of the heat generating portion 22 is selected from materials whose thermal conductivity is lower than copper. For example, the heat generating portion 22 may be made of copper, alloy of copper and tin (Cu—Sn), a metal such as silver, tin, stainless steel, nickel, and nickel chrome alloy, or alloy including at least one of silver, tin, stainless steel, nickel or nickel chrome alloy.

The capacitance sensor portion 25 has a transmitting electrode 251 and a receiving electrode 252. The transmitting electrode 251 and the receiving electrode 252 may be made of a metal material having a relatively small electric resistance value. A contact detection control device 29 is connected to the transmitting electrode 251 and the receiving electrode 252, respectively.

In a case that a predetermined voltage is applied between the transmitting electrode 251 and the receiving electrode 252 by the contact detection control device 29, an electric field is formed between the transmitting electrode 251 and the receiving electrode 252. Arrow symbol E in FIG. 3 represents an electric force line. Then, when a finger approaches between the transmitting electrode 251 and the receiving electrode 252, a part of the electric force lines E moves toward a side of the finger, and the electric field received by the receiving electrode 252 decreases.

The insulating layer 230 has high insulating properties, and is made of, for example, a polyimide film or an insulating resin.

This system or device has an electronic controller. The controller has at least one processor circuit. One example of a processor circuit is a processor circuit that executes a program which is an assembled instructions executable by a computer. The processor circuit may be so-called a microprocessor and may be provided as a chip. The controller includes a program and a non-transitory, tangible storage medium, e.g., a semi-conductor memory, for recording data. The processor circuit provides functions of the device according to this disclosure by executing a program. Another example of a processor circuit is a processor circuit including a plurality of logic circuits or analog circuits. A plurality of logic circuits or analog circuits are configured to provide a plurality of substantive elements and their electrical connections so as to provide functions of the apparatus according to this disclosure. The processor circuit may have various names such as accelerators, gate arrays, and FPGAs (Field-programmable gate arrays). The controller is also called a microcontroller or a microcomputer. The controller, having at least one processor circuit, is configured to perform as at least one unit, module, or section described in this disclosure.

The heater control device 28 and the contact detection control device 29 are configured as a computer including a CPU, a memory, an I/O, and the like, and the CPU executes various processes according to a program stored in the memory.

The contact detection control device 29 forms an electric field between the transmitting electrode 251 and the receiving electrode 252. The contact detection control device 29 collects detected values of capacitance values between the transmitting electrode 251 and the receiving electrode 252. The contact detection control device 29 performs analog-digital conversion on the collected and detected values of the capacitances, and outputs AD values after the analog-digital conversion to the heater control device 28.

The heater control device 28 is configured to energize the heat generating portion 22. The heater control device 28 determines the contact or non-contact of the object based on the AD value indicating the detection value of the capacitance between the transmission electrode 251 and the reception electrode 252 output from the contact detection control device 29.

Figure 5:
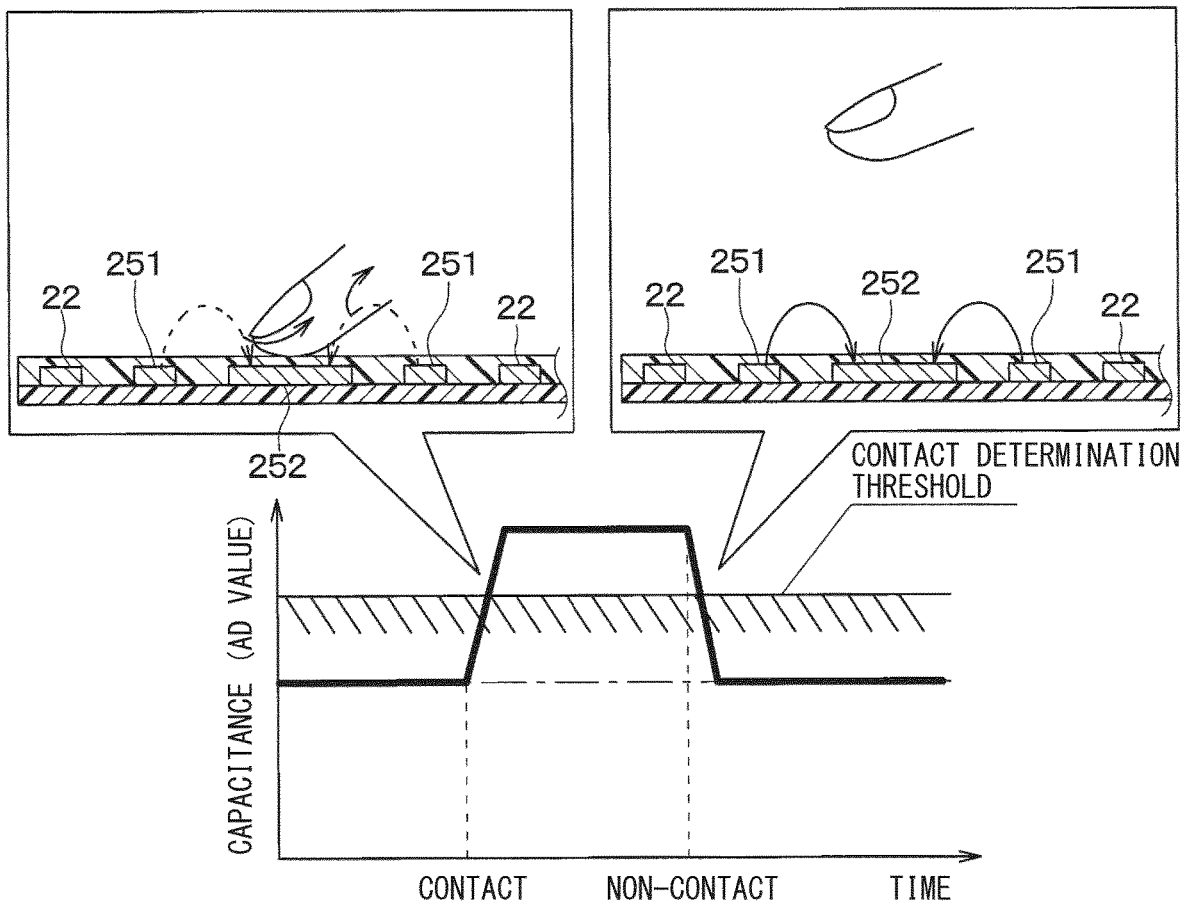
FIG. 5 is a diagram showing a capacitance change between a transmitting electrode and a receiving electrode in a case that a finger as an object once comes into contact with a capacitance sensor portion and then the finger becomes non-contact.

Next, the change in capacitance between the transmitting electrode 251 and the receiving electrode 252 in a case that an ambient temperature of the capacitance sensor portion 25 is constant is described. FIG. 5 is a diagram showing a capacitance change between a transmitting electrode 251 and a receiving electrode 252 in a case that a finger as an object once comes into contact with a capacitance sensor portion 25 and then the finger becomes a non-contact state. Note that FIG. 5 also shows a state in which a finger is approaching the capacitance sensor portion 25 and a state in which a finger is separated from the capacitance sensor portion 25. The vertical axis of FIG. 5 shows the detected value of the capacitance between the transmitting electrode 251 and the receiving electrode 252 as the AD value after analog-digital conversion. The horizontal axis of FIG. 5 is the energization time.

In a case that a finger comes into contact with the capacitance sensor portion 25, the AD value of the capacitance between the transmitting electrode 251 and the receiving electrode 252 becomes large. The heater device determines that the object is in a contact state, in a case that the AD value of the capacitance between the transmitting electrode 251 and the receiving electrode 252 is larger than a contact determination threshold value.

Further, the finger is separated from the capacitance sensor portion 25, the AD value of the capacitance between the transmitting electrode 251 and the receiving electrode 252 becomes smaller. The heater device determines that the object is in the non-contact state, in a case that the AD value of the capacitance between the transmitting electrode 251 and the receiving electrode 252 becomes equal to or less than the contact determination threshold value.

Figure 6:
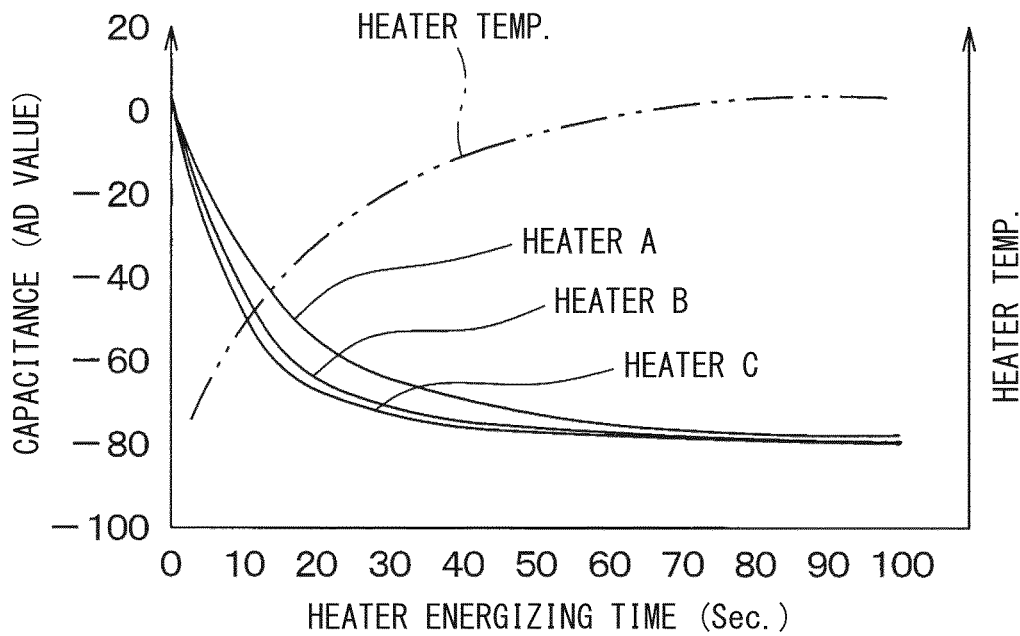
FIG. 6 is a diagram showing a temperature and a capacitance change of a heat generating portion with respect to energization time in heaters A to C with the same lot and the same shape.

By the way, when a temperature of the capacitance sensor portion 25 rises rapidly due to the heat generated by the heat generating portion 22, changes of resistance values or dimensional changes due to linear expansion of the transmitting electrode 251 and the receiving electrode 252 cause a changes in capacitance between the transmitting electrode 251 and the receiving electrode 252. FIG. 6 is a diagram showing change of a temperature and a capacitance of a heat generating portion 22 with respect to energization time in heaters A to C with the same lot and the same shape;

As shown in FIG. 6, the capacitance of each of the heaters A to C is decreased as the temperature of each of the heaters A to C rises. FIG. 6 also shows that there are differences among changes in capacitance even in the same lot and the same shape. As described above, it is understood that changes in capacitance caused by a temperature change have individual variations widely vary according to each product.

Figure 7:
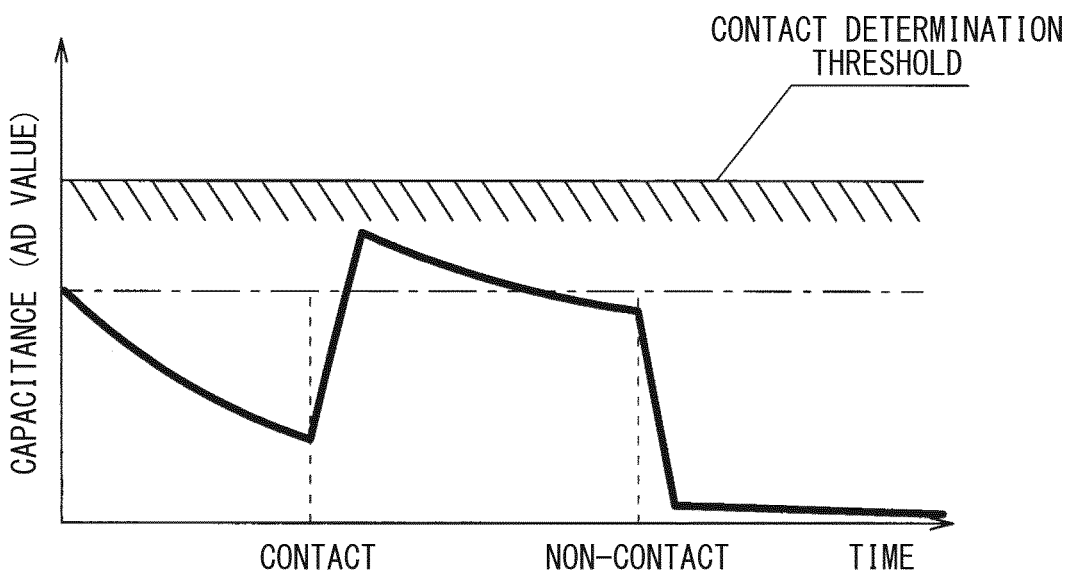
FIG. 7 is a diagram showing an example in which a temperature of the capacitance sensor portion rises and a finger comes into contact with the capacitance sensor unit, but an AD value indicating a capacitance between a transmitting electrode and a receiving electrode does not reach a contact determination threshold value.

Therefore, if a temperature of the capacitance sensor portion 25 rises and the AD value indicating the capacitance between the transmitting electrode 251 and the receiving electrode 252 becomes smaller, as shown in FIG. 7, even if a finger comes into contact with the capacitance sensor portion unit 25, the AD value indicating the capacitance does not reach the contact determination threshold value. Therefore, a conventional heater device has a problem that it is difficult to determine that a finger comes into contact with the capacitance sensor portion 25.

Figure 8:
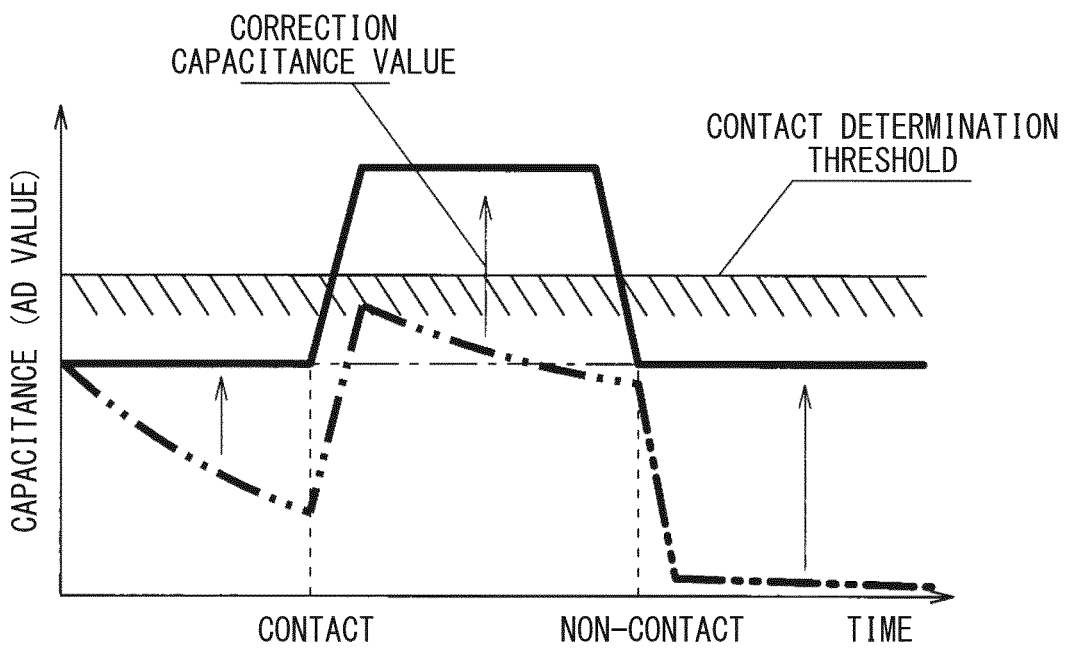
FIG. 8 is a diagram showing an example in which a presence or an absence of a finger contact is determined based on an excluded detected value which is a value calculated by excluding a changed value from a detected value of the capacitance, the changed value caused by a temperature change of the capacitance being obtained based on a temperature detected by the thermistor.

FIG. 8 is a diagram showing an example in which a presence or an absence of a finger contact is determined based on an excluded detected value which is a value calculated by excluding a changed value from a detected value of the capacitance, the changed value caused by a temperature change of the capacitance being obtained based on a temperature detected by the thermistor. This example is similar to an embodiment disclosed in JP2014-190674A.

Figure 9:
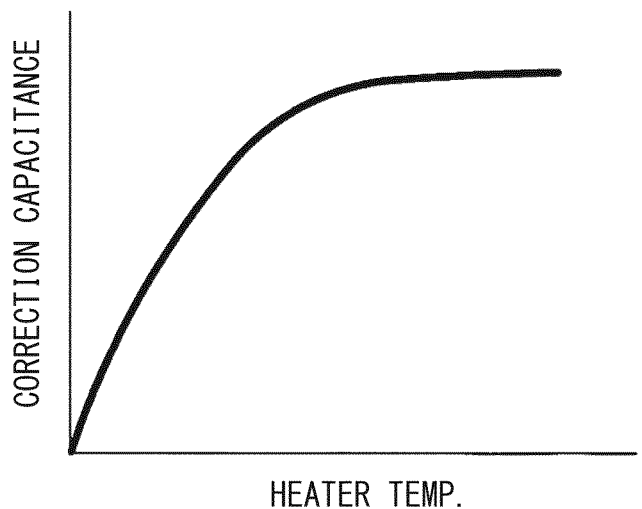
FIG. 9 is a diagram for explaining a corresponding table associated with a corrected capacitance corresponding to a heater temperature.

This device obtains a corrected capacitance according to a detected temperature value by referring to a corresponding table in which a heater temperature as shown in FIG. 9 and a corrected capacitance corresponding to the heater temperature are associated with each other. This device determines a presence or absence of a contact state of a finger based on a magnitude relationship between a differential value and a threshold value. The differential value is a difference between the corrected capacitance obtained by the corresponding table and the detected capacitance value. If a heater has a characteristics close to that of the corresponding table, it is possible to use the corrected capacitance according to the detected temperature value obtained by referring to the corresponding table, and determine the presence or absence of the contact state of a finger.

Figure 10:
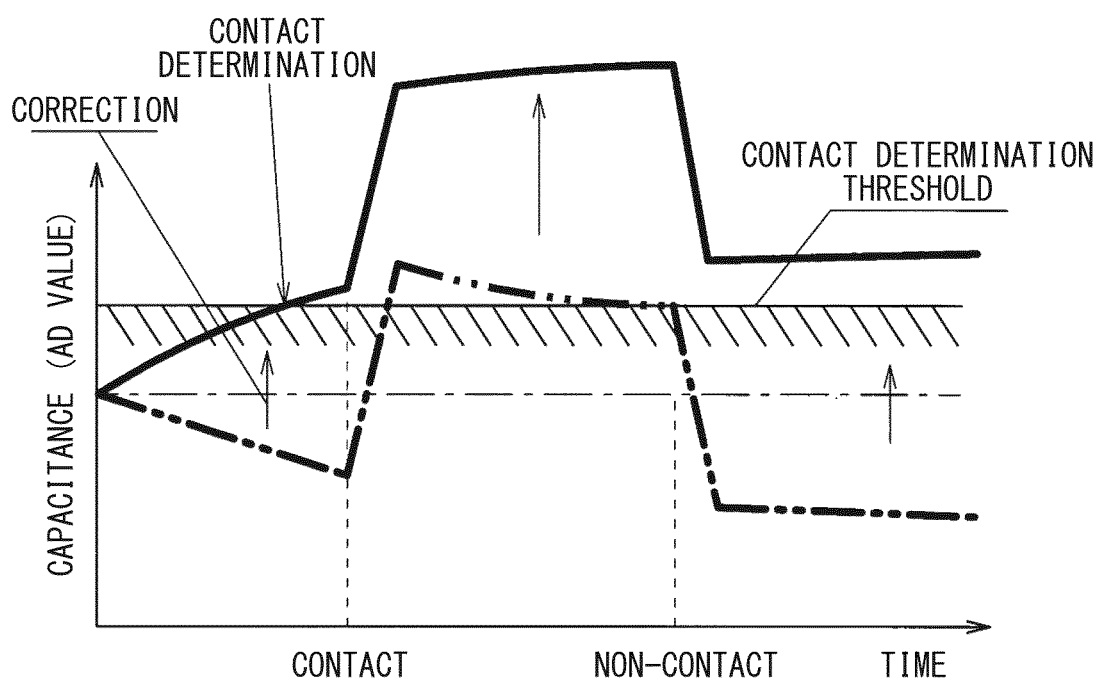
FIG. 10 is a diagram showing an example in which a contact state of a finger is erroneously determined due to an excessively large corrected capacitance in a case that a heater has a characteristic largely departed from a characteristics of the corresponding table due to individual variations.

However, in a case of a heater having a characteristic which is greatly different from the characteristics of the corresponding table due to individual variation, for example, as shown in FIG. 10, the corrected capacitance may become too large. In this case, even if no finger is in the contact state, it may be erroneously determined that there may be a finger in the contact state. Further, the device may make an error determination of the non-contact state when a finger becomes the non-contact state after the finger once becomes the contact state.

Figure 11:
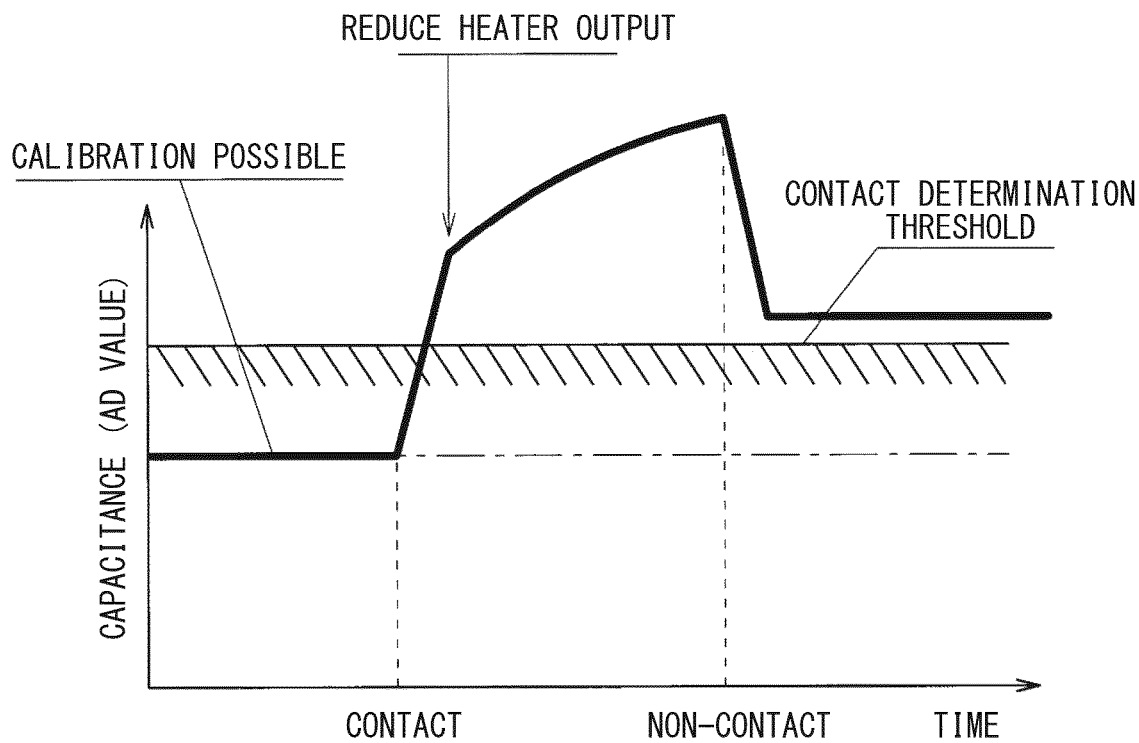
FIG. 11 is a diagram showing an example in which the AD value indicating the capacitance between the transmitting electrode and the receiving electrode does not fall below the contact determination threshold value even if the object becomes a non-contact in a case that the heater output is reduced in response to a detection of an object.

Further, a heater device may be configured to reduce the heater output in response to a detection of the contact state of a finger. In this case, if the heater output is reduced, a temperature of the heater is also reduced, as shown in FIG. 11, the corrected capacitance may be gradually increased. In this configuration, even if a finger becomes the non-contact state after the contact state, the AD value indicating the corrected capacity does not fall below the contact determination threshold value. As a result, it may be erroneously determined that the contact state, even though the finger is in the non-contact state.

Figure 12:
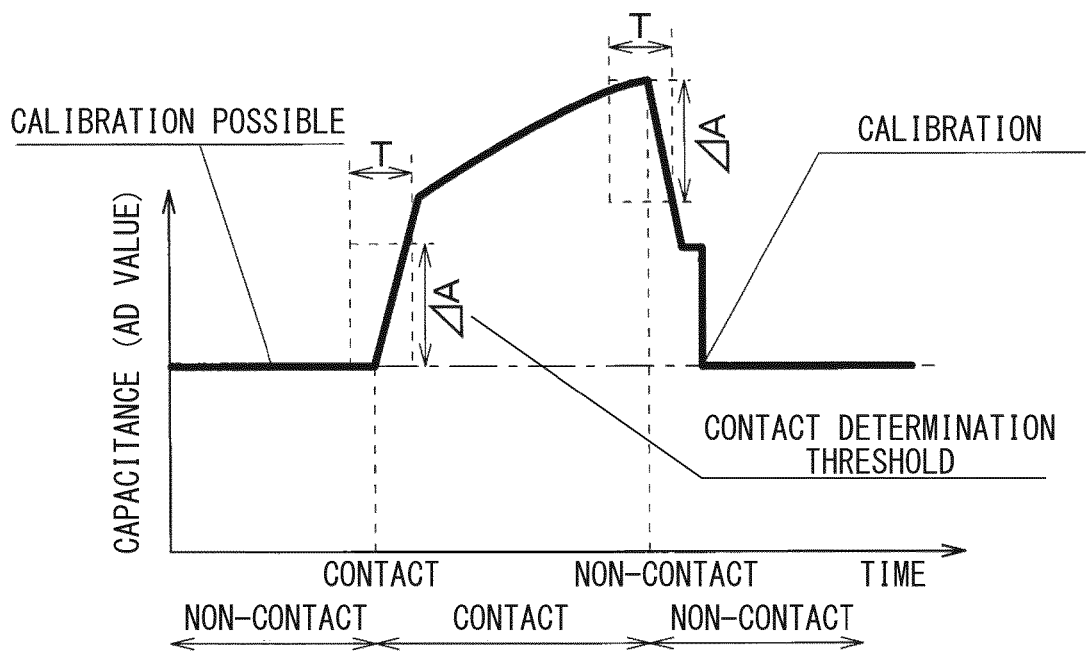
FIG. 12 is a diagram for explaining determination of a contact and a non-contact of an object.

Therefore, as shown in FIG. 12, the heater device of the present embodiment performs a process for determining an object contact in a case that a change in a capacitance between the transmitting electrode 251 and the receiving electrode 252 per predetermined unit time T is an increase equal to or larger than a determination threshold value ΔA (Delta-A). The heater device of the present embodiment performs a process for determining a contact state of an object in a case that a change in a capacitance between the transmitting electrode 251 and the receiving electrode 252 per predetermined unit time T is a decrease equal to or larger than a determination threshold value ΔA.

Figure 13:
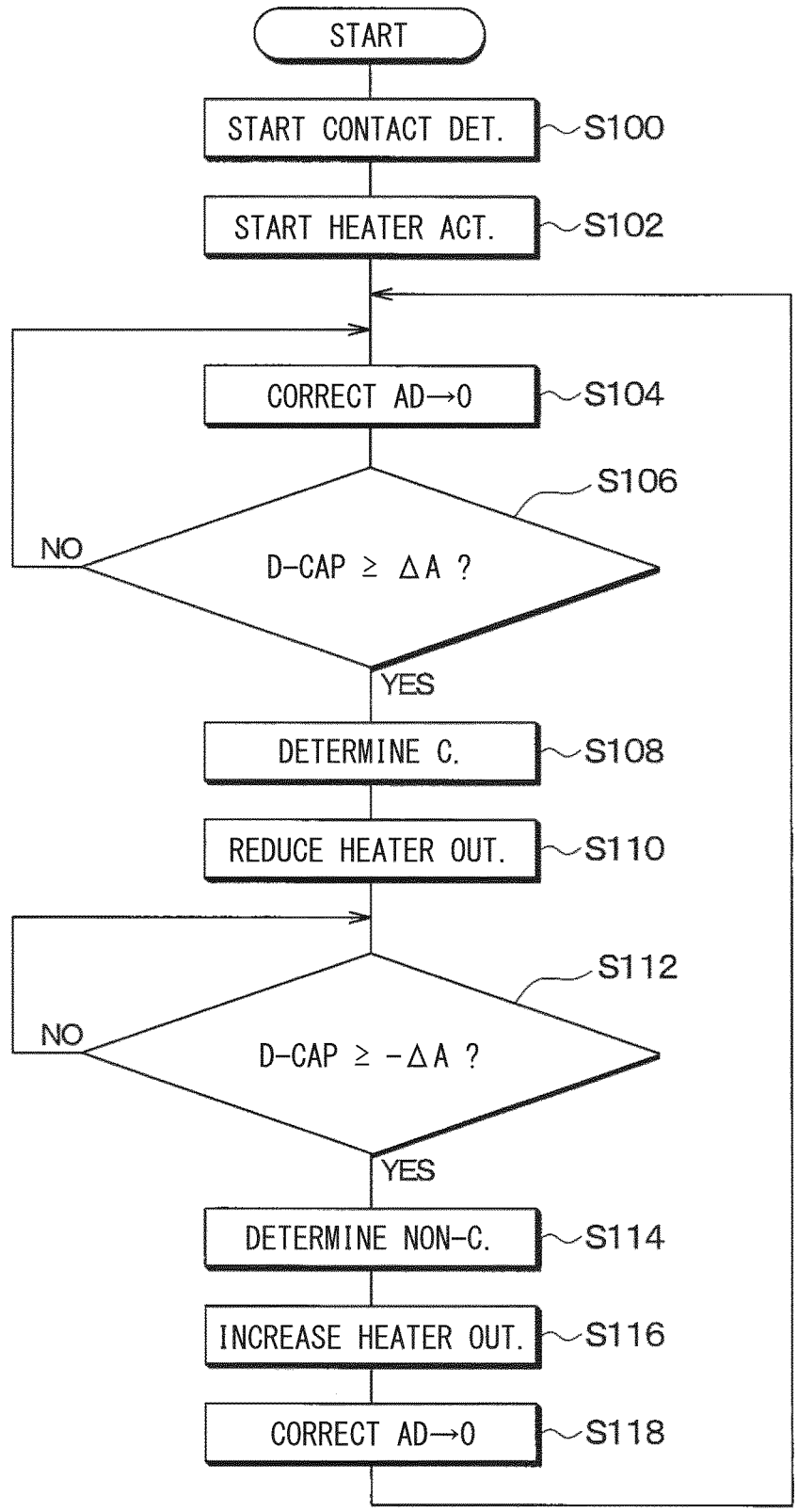
FIG. 13 is a flowchart of a controller according to the first embodiment.

FIG. 13 shows a flowchart of this process. The flowchart shown in FIG. 12 shows processing of the heater control device 28 and the contact detection control device 29. Here, the processing of the heater control device 28 and the contact detection control device 29 are described as the processing of the control devices 28 and 29. The control devices 28 and 29 perform the process shown in FIG. 13 in a case that the heater device 20 is activated and becomes an operating state.

First, the control devices 28 and 29 start contact detection in S100. Specifically, a predetermined voltage is applied between the transmitting electrode 251 and the receiving electrode 252. As a result, an electric field is formed between the transmitting electrode 251 and the receiving electrode 252.

Next, the control devices 28 and 29 start an activation of the heater in S102. Specifically, an energization of the heat generating portion 22 is started. As a result, a temperature of the heat generating portion 22 is increased. Then, the heat generating portion 22 generates heat to a predetermined radiation temperature, and radiates a radiant heat which makes the occupant 12 feel warm.

Figure 14:
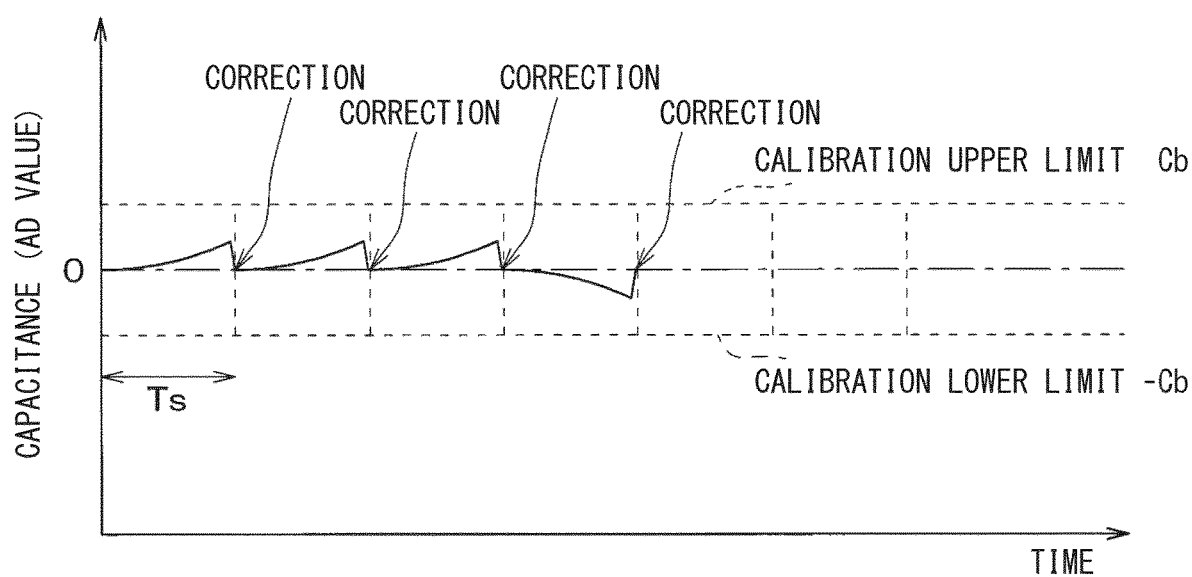
FIG. 14 is a diagram for explaining a process for correcting an AD value indicating a capacitance to 0 at predetermined time intervals.

Next, in S104, the control devices 28 and 29 correct the AD value indicating the capacitance between the transmitting electrode 251 and the receiving electrode 252 to a reference value for a predetermined period of time. In this embodiment, the AD value indicating the capacitance is corrected to 0 (Zero). Specifically, as shown in FIG. 14, the AD value indicating the capacitance is corrected to 0 every predetermined time interval Ts. That is, the process of storing the AD value indicating the capacitance between the transmitting electrode 251 and the receiving electrode 252 in the memory as 0 is repeatedly performed. However, this correction process is performed under a condition in which a magnitude of a change in capacitance between the transmitting electrode 251 and the receiving electrode 252 is less than a predetermined reference value Cb which is less than the determination threshold value ΔA. Here, the predetermined time interval Ts is a very short time interval as compared with the reference step T corresponding to the predetermined reference time.

If a magnitude of the change in capacitance between the transmitting electrode 251 and the receiving electrode 252 at a predetermined time interval Ts is equal to or larger than a calibration upper limit Cb, there may be a possibility of both the contact state of the object and the non-contact state of the object, therefore the capacitance is not corrected. If a magnitude of the change in capacitance between the transmitting electrode 251 and the receiving electrode 252 at a predetermined time interval Ts is less than a calibration lower limit Cb, there may be a possibility of both the object contact and the object non-contact, therefore the capacitance is not corrected.

Next, in S106, the control devices 28 and 29 determine whether or not the change D-CAP in capacitance between the transmitting electrode 251 and the receiving electrode 252 in the reference step T is an increase equal to or larger than the determination threshold value ΔA. This step may be expressed as D-CAP>=ΔA?. Specifically, it is determined that whether the difference is an increase equal to or larger than the determination threshold value ΔA or not. The difference is between the detected value of the capacitance between the transmitting electrode 251 and the receiving electrode 252 and the detected value of the capacitance between the transmitting electrode 251 and the receiving electrode 252 before the reference step T. In a case that the AD value indicating the capacitance between the transmitting electrode 251 and the receiving electrode 252 is corrected to the reference value after elapsing the reference step T, it is determined whether a change in capacitance between the transmitting electrode 251 and the receiving electrode 252 with respect to the corrected value is an increase equal to or larger than the determination threshold value ΔA or not. Here, the reference step T corresponds to a predetermined unit time. Further, the determination threshold value ΔA is a positive value.

Here, in a case that the object does not come into contact with the capacitance sensor portion 25 and the change in capacitance between the transmitting electrode 251 and the receiving electrode 252 within the period of the reference step T is not an increase equal to or larger than the determination threshold value ΔA, the control devices 28 and 29 return to step S104 without determining that the object comes into contact with.

Further, in a case that the object comes into contact with the capacitance sensor portion 25 and the change in capacitance between the transmitting electrode 251 and the receiving electrode 252 within the period of the reference step T is an increase equal to or larger than the determination threshold value ΔA, the control devices 28 and 29 determines that the object comes into contact with. Then, in S110, the heater output is reduced. Specifically, an energization amount to the heat generating portion 22 is reduced.

Next, in S112, the control devices 28 and 29 determine whether or not the change D-CAP in capacitance between the transmitting electrode 251 and the receiving electrode 252 in the reference step T is a decrease equal to or larger than the determination threshold value ΔA. This step may be expressed as D-CAP>=−ΔA?. Specifically, it is determined that whether the difference is a decrease equal to or larger than the determination threshold value ΔA or not. The difference is between the detected value of the capacitance between the transmitting electrode 251 and the receiving electrode 252 and the detected value of the capacitance between the transmitting electrode 251 and the receiving electrode 252 before the reference step T.

Further, in a case that the object is separated from the capacitance sensor portion 25 and the change in capacitance between the transmitting electrode 251 and the receiving electrode 252 within the period of the reference step T is a decrease equal to or larger than the determination threshold value ΔA, the control devices 28 and 29 determines that the object becomes a non-contact state in S108. Then, in S116, the heater output is increased. Specifically, an energization amount to the heat generating portion 22 is increased so as to return the amount to that in before the reducing operation.

Next, in S118, the control devices 28 and 29 correct the AD value indicating the capacitance between the transmitting electrode 251 and the receiving electrode 252 to a reference value for a predetermined period of time. In this embodiment, the AD value indicating the capacitance is corrected to 0 (Zero). Specifically, as shown in FIG. 14, a process of storing the AD value indicating the capacitance between the transmitting electrode 251 and the receiving electrode 252 in the memory as 0 is repeatedly performed at predetermined time intervals Ts, and the process returns to S104. However, this correction process is performed under a condition in which a magnitude of a change in capacitance between the transmitting electrode 251 and the receiving electrode 252 is less than a predetermined reference value Cb which is less than the determination threshold value ΔA.

In the present embodiment, in a case that an object comes into contact with the capacitance sensor portion 25, the capacitance between the transmitting electrode 251 and the receiving electrode 252 increases. Contrary, in a case that an object separates from the capacitance sensor portion 25, the capacitance between the transmitting electrode 251 and the receiving electrode 252 decreases.

However, the device may be configured to generate an opposite response. For example, in a case that the object comes into contact with the capacitance sensor portion 25, the capacitance between the transmitting electrode 251 and the receiving electrode 252 decreases. Contrary, in a case that the object separates from the capacitance sensor portion 25, the capacitance between the transmitting electrode 251 and the receiving electrode 252 increases.

In a case that it is determined that the change in capacitance between the transmitting electrode 251 and the receiving electrode 252 per predetermined unit time T is a change in one direction and the opposite direction and equal to or larger than the first determination threshold value, the contact state of an object may be determined. In a case that it is determined that the change in capacitance between the transmitting electrode 251 and the receiving electrode 252 per predetermined unit time T is a change in one direction and the opposite direction and equal to or larger than the second determination threshold value, the non-contact state of an object may be determined.

In the heater device of the present embodiment, for example, in a case that the reference step T=2 seconds, the contact state of an object, e.g., a finger, may be determined within about 2 seconds after the object comes into contact with the capacitance sensor portion 25, and the heater output is reduced. This reduction of the heater output is controlled by the control devices 28 and 29 in response to a contact detection by using the capacitance sensor portion 25. However, such a time lag of a contact determination does not matter because an occupant does not feel uncomfortable in such a short contact within a short time, e.g., several seconds to several tens of seconds. The heater device of the present embodiment has a mechanical structure of the heat generating portion in which a temperature of a contacted portion rapidly drops. For example, due to a thin structure of the heater device, an object contacted may removes thermal energy and lowers a temperature of a part where the object contacted. In this embodiment, both a temperature reducing electric control by the control devices 28 and 29 and a temperature reducing mechanical structure function to keep an occupant comfortable even if the occupant touches the surface of the heater device.

As described above, the heater device of the present embodiment has a heat generating portion 22 arranged on the insulating base material 23 and a plurality of electrodes 251 and 252 arranged on the insulating base material 23 for detecting a contact or a non-contact of an object. Further, the heater device has a contact determination unit which is configured to determine the contact or the non-contact of the object based on a change in capacitance between the plurality of electrodes 251 and 252. The contact determination unit is configured to determine the contact of the object in response to a determination that the change in capacitance between the plurality of electrodes 251a and 252 per predetermined unit time is a change in one direction and equal to or larger than the first determination threshold value.

The contact determination unit is configured to determine the non-contact of the object in response to a determination that the change in capacitance between the plurality of electrodes 251 and 252 per predetermined unit time is a change in a direction opposite to the one direction and equal to or larger than the second determination threshold value.

According to this configuration, the contact determination unit is configured to determine the contact of the object in response to a determination that the change in capacitance between the plurality of electrodes 251 and 252 per predetermined unit time is a change in one direction and equal to or larger than the first determination threshold value.

The contact determination unit is configured to determine the non-contact of the object in response to a determination that the change in capacitance between the plurality of electrodes 251 and 252 per predetermined unit time is a change in a direction opposite to the one direction and equal to or larger than the second determination threshold value. Therefore, it is possible to determine the contact or the non-contact more accurately while suppressing the influence of temperature change.

Further, the heater device of the present embodiment includes a first correction unit (S104) which corrects a capacitance between the plurality of electrodes 251 and 252 to a reference value. The first correction unit corrects a capacitance to a reference value at every predetermined time intervals Ts shorter than the predetermined unit time T in response to a determination of the contact determination unit that a change in capacitance between the plurality of electrodes 251 and 252 per predetermined unit time T is a change in one direction and less than the first determination threshold value. However, this correction process is performed under a condition in which a magnitude of a detected value of capacitance between the plurality of electrodes 251 and 252 is less than a predetermined reference value which is less than a smaller one of the first determination threshold value and the second determination threshold value.

Then, the contact determination unit determines a change in capacitance between the plurality of electrodes 251 and 252 per predetermined unit time T as a change in capacitance between the plurality of electrodes with respect to the reference value corrected by the first correction unit.

Therefore, it is possible to suppress an influence of a change in capacitance due to a temperature change during the predetermined unit time T immediately before the contact determination of the object. Further, if a magnitude of the capacitance becomes too large due to the temperature change, there is a possibility of overflow in computer calculation for processing the capacitance. However, by correcting the capacitance to the reference value, it is possible to prevent computer overflow, and it is possible to perform the contact and non-contact determination.

Further, the heater device of the present embodiment includes a second correction unit (S118) which corrects a capacitance between the plurality of electrodes to a reference value. The second correction unit corrects a capacitance between the plurality of electrodes to a reference value at every predetermined time intervals (Ts) shorter than the predetermined unit time in response to a determination of the contact determination unit that a change in capacitance between the plurality of electrodes per predetermined unit time T is a change in a direction opposite to the one direction and equal to or larger than the second determination threshold value. However, this correction process is performed under a condition in which a magnitude of a detected value of capacitance between the plurality of electrodes is less than a predetermined reference value which is less than a smaller one of the first determination threshold value and the second determination threshold value.

Then, the contact determination unit determines a change in capacitance between the plurality of electrodes per predetermined unit time T as a change in capacitance between the plurality of electrodes with respect to the reference value corrected by the second correction unit.

Therefore, it is possible to suppress an influence of a change in capacitance due to a temperature change during the predetermined unit time T immediately after the non-contact determination of the object. Further, if a magnitude of the capacitance becomes too large due to the temperature change, there is a possibility of overflow in computer calculation for processing the capacitance. However, by correcting the capacitance to the reference value, it is possible to prevent computer overflow, and it is possible to perform the contact and non-contact determination.

Further, according to a fourth aspect, the heater device further comprising an energization amount reducing unit which reduces an energization amount to the heat generating portion 22 in response to that the contact determining unit determines the contact of the object.

Therefore, it is possible to reduce an energization amount to the heat generating portion 22 by more accurately determining the contact of the object without being affected by the temperature change.

Second Embodiment

A heater device according to the second embodiment is described with reference to FIGS. 15 to 16. The configuration of the heater device of the present embodiment is the same as that of the heater device of the first embodiment. The heater device of the present embodiment has different processing of the control devices 28 and 29 as compared with the heater device of the first embodiment.

Figure 15:
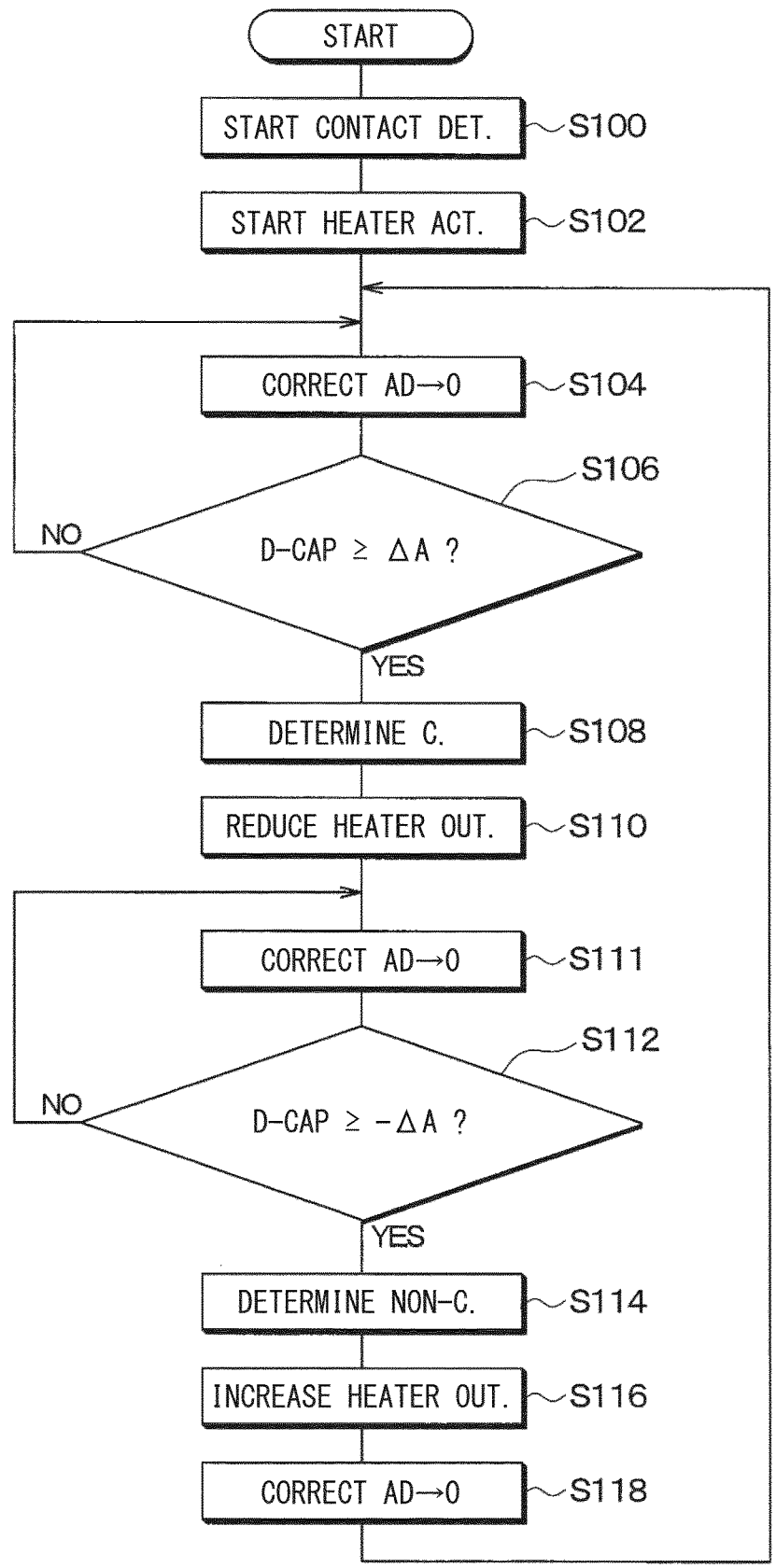
FIG. 15 is a flowchart of a controller according to a second embodiment.
Figure 16:
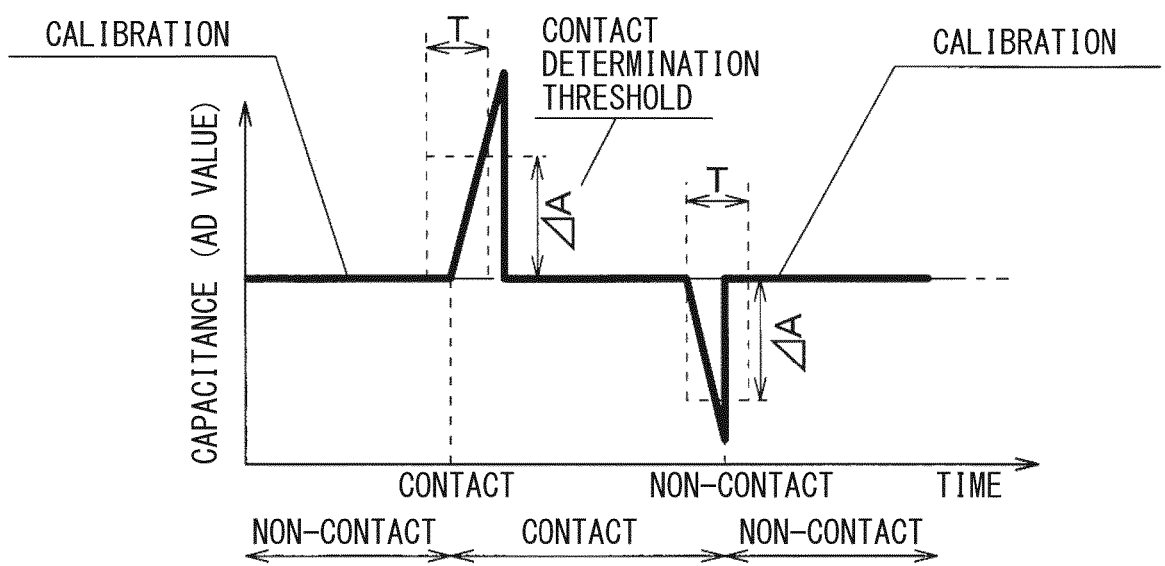

The flowcharts of the control devices 28 and 29 of this embodiment are shown in FIG. 15. The control devices 28 and 29 of the present embodiment are different in aspects where a process of step S111 is performed after step S106 in FIG. 13 determines YES in comparison with the control devices 28 and 29 of the first embodiment.

The control devices 28 and 29 correct, in S111, an AD value indicating the capacitance between the transmitting electrode 251 and the receiving electrode 252, if it is determined YES in S106, and the heater output is reduced in S110. In the present embodiment, as shown in FIG. 16, after the contact determination, the AD value indicating the capacitance is corrected to 0. Specifically, the control devices 28 and 29 repeatedly perform a process of storing the AD value indicating the capacitance between the transmitting electrode 251 and the receiving electrode 252 in the memory as 0 at predetermined time intervals Ts. However, this process is performed in a case that a magnitude of the change in capacitance between the transmitting electrode 251 and the receiving electrode 252 is less than the predetermined reference value Cb which is smaller than the determination threshold value ΔA. Here, the predetermined time interval Ts is a very short time interval as compared with the reference step T corresponding to the predetermined reference time.

Next, in S112, the control devices 28 and 29 determine whether or not the change D-CAP in capacitance between the transmitting electrode 251 and the receiving electrode 252 in the reference step T is a decrease equal to or larger than the determination threshold value ΔA. This step may be expressed as D-CAP>=−ΔA?. Specifically, it is determined that whether the difference is a decrease equal to or larger than the determination threshold value ΔA or not. The difference is between the detected value of the capacitance between the transmitting electrode 251 and the receiving electrode 252 and the detected value of the capacitance between the transmitting electrode 251 and the receiving electrode 252 before the reference step T.

Here, if the change in capacitance between the transmitting electrode 251 and the receiving electrode 252 in the reference step T is less than the determination threshold value ΔA, the process returns to S111. If the change in capacitance between the transmitting electrode 251 and the receiving electrode 252 in the reference step T is a decrease equal to or larger than the determination threshold value ΔA, the process proceeds to S114.

The present embodiment can achieve the effects and advantages, which are obtained from the structure common to the first embodiment.

Other Embodiments (1) In each of the above embodiment, the heater control device 28 and the contact detection control device 29 are configured as computers equipped with a CPU, a memory, an I/O, etc., but the heater control device 28 and the contact detection control device 29 may not be configured as such computers.

(2) In each of the above embodiment, the control devices 28 and 29 are designed to reduce the heater output in S110 in a case that an object comes into contact with the capacitance sensor portion 25 and the change in capacitance between the transmitting electrode 251 and the receiving electrode 252 in the reference step T is an increase equal to or larger than the determination threshold value ΔA. On the other hand, the heater output may be stopped.

The present disclosure is not limited to the above-described embodiments, and can be appropriately modified. Individual elements or features of a particular embodiment are generally not limited to that particular embodiment, but, where applicable, are interchangeable and can be used in a selected embodiment, even if not specifically shown or described. Further, in each of the above-mentioned embodiments, it goes without saying that components of the embodiment are not necessarily essential except for a case in which the components are particularly clearly specified as essential components, a case in which the components are clearly considered in principle as essential components, and the like. A quantity, a value, an amount, a range, or the like, if specified in the above-described example embodiments, is not necessarily limited to the specific value, amount, range, or the like unless it is specifically stated that the value, amount, range, or the like is necessarily the specific value, amount, range, or the like, or unless the value, amount, range, or the like is obviously necessary to be the specific value, amount, range, or the like in principle. Further, in each of the embodiments described above, when materials, shapes, positional relationships, and the like, of the components and the like, are mentioned, they are not limited to these materials, shapes, positional relationships, and the like, unless otherwise specified and unless limited to specific materials, shapes, positional relationships, and the like.

CONCLUSION

According to a first aspect shown in part or all of the above embodiments, the heater device has a heat generating portion arranged on an insulating base material, and a plurality of electrodes which are arranged on the insulating base material and are configured to detect a contact or a non-contact of an object. Further, the heater device has a contact determination unit which is configured to determine the contact or the non-contact of the object based on a change in capacitance between the plurality of electrodes. The contact determination unit is configured to determine (i) the contact of the object in response to a determination that the change in capacitance between the plurality of electrodes per predetermined unit time is a change in one direction and equal to or larger than a first determination threshold value.

The contact determination unit is configured to determine (ii) the non-contact of the object in response to a determination that the change in capacitance between the plurality of electrodes per predetermined unit time is a change in a direction opposite to the one direction and equal to or larger than a second determination threshold value.

Further, according to a second aspect, the heater device includes a first correction unit which corrects the capacitance between the plurality of electrodes to a reference value. The first correction unit corrects a capacitance between the plurality of electrodes to a reference value at every predetermined time intervals shorter than the predetermined unit time in response to a determination of the contact determination unit that a change in capacitance between the plurality of electrodes per predetermined unit time is a change in one direction and less than the first determination threshold value. However, this correction process is performed under a condition in which a magnitude of a detected value of capacitance between the plurality of electrodes is less than a predetermined reference value which is less than a smaller one of the first determination threshold value and the second determination threshold value.

Then, the contact determination unit determines a change in capacitance between the plurality of electrodes per predetermined unit time as a change in capacitance between the plurality of electrodes with respect to the reference value corrected by the first correction unit.

Therefore, it is possible to suppress an influence of a change in capacitance due to a temperature change during the predetermined unit time T immediately before the contact determination of the object. Further, if a magnitude of the capacitance becomes too large due to the temperature change, there is a possibility of overflow in computer calculation for processing the capacitance. However, by correcting the capacitance to the reference value, it is possible to prevent computer overflow, and it is possible to perform the contact and non-contact determination.

Further, according to a third aspect, the heater device includes the second correction unit which corrects the capacitance between the plurality of electrodes to a reference value. The second correction unit corrects a capacitance between the plurality of electrodes to a reference value at every predetermined time intervals shorter than the predetermined unit time in response to a determination of the contact determination unit that a change in capacitance between the plurality of electrodes per predetermined unit time T is a change in a direction opposite to the one direction and equal to or larger than the second determination threshold value. However, this correction process is performed under a condition in which a magnitude of a detected value of capacitance between the plurality of electrodes is less than a predetermined reference value which is less than a smaller one of the first determination threshold value and the second determination threshold value.

Then, the contact determination unit determines a change in capacitance between the plurality of electrodes per predetermined unit time T as a change in capacitance between the plurality of electrodes with respect to the reference value corrected by the second correction unit.

Therefore, it is possible to suppress an influence of a change in capacitance due to a temperature change during the predetermined unit time T immediately after the non-contact determination of the object. Further, if a magnitude of the capacitance becomes too large due to the temperature change, there is a possibility of overflow in computer calculation for processing the capacitance. However, by correcting the capacitance to the reference value, it is possible to prevent computer overflow, and it is possible to perform the contact and non-contact determination.

Further, according to a fourth aspect, the heater device further comprising an energization amount reducing unit which reduces an energization amount to the heat generating portion 22 in response to that the contact determining unit determines the contact of the object.

Therefore, it is possible to reduce an energization amount to the heat generating portion 22 by more accurately determining the contact of the object without being affected by the temperature change.

Steps S106, S108, S112, and S114 correspond to the contact determination unit, S104 corresponds to the first correction unit, S118 corresponds to the second correction unit, and S110 corresponds to the energization amount reducing unit.

What is claimed is:

1. A heater device comprising:
   a heat generating portion arranged on an insulating base material;
   a plurality of electrodes which are arranged on the insulating base material and are configured to detect a contact or a non-contact of an object; and
   a controller, having at least one processor circuit, which is configured to perform as a contact determination unit which determines the contact or the non-contact of the object based on a change in capacitance between the plurality of electrodes, wherein
   the contact determination unit is configured to determine:
   (i) the contact of the object in response to a determination that the change in capacitance between the plurality of electrodes per predetermined unit time is a change in one direction and equal to or larger than a first determination threshold value; and
   (ii) the non-contact of the object in response to a determination that the change in capacitance between the plurality of electrodes per predetermined unit time is a change in a direction opposite to the one direction and equal to or larger than a second determination threshold value, wherein
   the controller is further configured to perform as a first correction unit which is configured to correct the capacitance between the plurality of electrodes to a reference value at every predetermined time intervals shorter than a predetermined unit time in response to a determination of the contact determination unit that a change in capacitance between the plurality of electrodes per predetermined unit time is a change in one direction and less than the first determination threshold value, and wherein
   the first correction unit performs correction under a condition in which a magnitude of a detected value of capacitance between the plurality of electrodes is less than a predetermined reference value which is less than a smaller one of the first determination threshold value and the second determination threshold value to suppress the influence of a change in capacitance due to a temperature change before the contact determination of the object, and wherein
   the contact determination unit determines a change in capacitance between the plurality of electrodes per predetermined unit time as a change in capacitance between the plurality of electrodes with respect to a reference value corrected by the first correction unit.

2. The heater device claimed in claim 1, wherein
   the controller is further configured to perform as an energization amount reducing unit which reduces an energization amount to the heat generating portion in response to that the contact determining unit determines the contact of the object.

3. A heater device comprising:
   a heat generating portion arranged on an insulating base material;
   a plurality of electrodes which are arranged on the insulating base material and are configured to detect a contact or a non-contact of an object; and
   a controller, having at least one processor circuit, which is configured to perform as a contact determination unit which determines the contact or the non-contact of the object based on a change in capacitance between the plurality of electrodes, wherein the contact determination unit is configured to determine:
(i) the contact of the object in response to a determination that the change in capacitance between the plurality of electrodes per predetermined unit time is a change in one direction and equal to or larger than a first determination threshold value; and
(ii) the non-contact of the object in response to a determination that the change in capacitance between the plurality of electrodes per predetermined unit time is a change in a direction opposite to the one direction and equal to or larger than a second determination threshold value, wherein the controller is further configured to perform as a second correction unit which is configured to correct the capacitance between the plurality of electrodes to a reference value at every predetermined time intervals shorter than a predetermined unit time in response to a determination of the contact determination unit that a change in capacitance between the plurality of electrodes per predetermined unit time is a change in a direction opposite to the one direction and equal to or larger than the second determination threshold value, and wherein the second correction unit performs corrections under a condition in which a magnitude of a detected value of capacitance between the plurality of electrodes is less than a predetermined reference value which is less than a smaller one of the first determination threshold value and the second determination threshold value to suppress the influence of a change in capacitance due to a temperature change before the non-contact determination of the object, and wherein the contact determination unit determines a change in capacitance between the plurality of electrodes per predetermined unit time as a change in capacitance between the plurality of electrodes with respect to a reference value corrected by the second correction unit.

4. The heater device claimed in claim 3, wherein the controller is further configured to perform as an energization amount reducing unit which reduces an energization amount to the heat generating portion in response to that the contact determining unit determines the contact of the object.

* * * * *